Aug. 15, 1961 H. LEFKOWITZ 2,996,683
STABILIZED TUNED TRANSISTOR AUDIO AMPLIFIER
Filed July 7, 1959
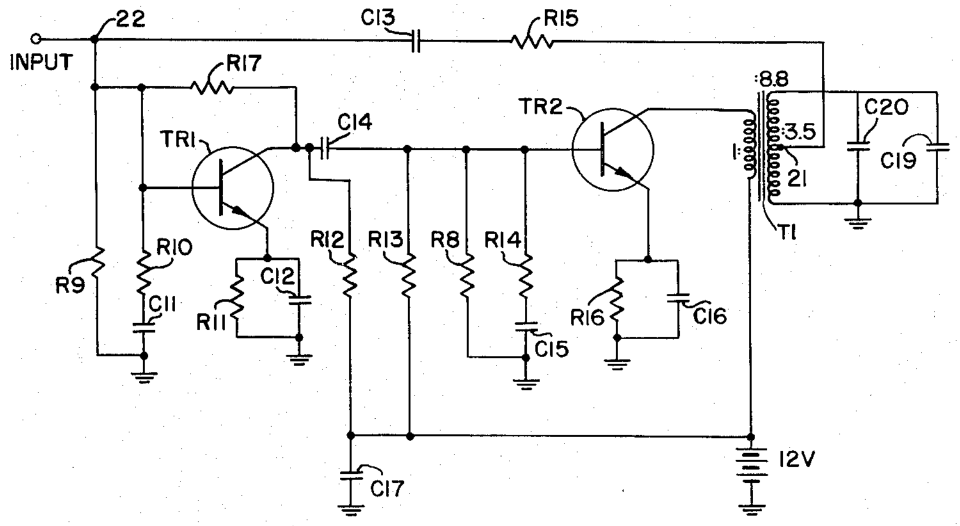
INVENTOR.
HOWARD LEFKOWITZ
BY
ATTORNEYS.

2,996,683
STABILIZED TUNED TRANSISTOR AUDIO AMPLIFIER

Howard Lefkowitz, Silver Spring, Md., assignor to the United States of America as represented by the Secretary of the Navy Filed July 7, 1959, Ser. No. 825,612
1 Claim. (Cl. 330—21)
(Granted under Title 35, U.S. Code (1952), sec. 266)

The invention described herein may be manufactured and used by or for the Government of the United States of America for governmental purposes without the payment of any royalties thereon or therefor.

This invention relates to an amplifier circuit and more particularly it relates to the use of a transistor amplifier for amplification of low level audio signals of a particular frequency with maximum efficiency and minimum noise.

The prior art included a single stage vacuum tube tuned amplifier using a negative feedback loop which had a relatively large power consumption. This method required a high impedance circuit which was attended by increased noise pick-up, finite life of the tube, a plurality of power supplies, a tube having satisfactory gas and grid current characteristics and the circuit requiring special precision components.

It is an object of this invention to provide a relatively simple circuit capable of performing essentially the same function as the prior art, but with less noise and being more dependable.

It is also an object of this novel circuit to provide certain simple and distinctive arrangements for utilizing an overall negative feedback loop for a tuned transistor audio amplifier. This novel circuit utilizes high frequency transistors in the overall feedback loop amplifier to simplify stabilizing problems. In addition this novel circuit is able to use a simple series R.C. network to achieve more than adequate stability margins.

It is a further object of this invention to provide an amplifier requiring substantially all standard components with a small power consumption and a minimum of pick-up noise.

Further objects and advantages of the invention along with an understanding of the principles of operation thereof will be made clear from the following description when considered in connection with the accompanying drawing in which the single figure is a schematic circuit diagram of the novel circuit constructed in accordance with the inventive concept described herein.

Referring now to the drawing, this invention uses two stages of transistor amplification as shown by TR1 and TR2. Each stage is of the common-emitter type which produces a 180 degree phase shift from input to output voltage. Direct current feedback networks are provided for each stage to stabilize its quiescent operating point thus maintaining the signal handling capabilities of the amplifier over a wide range of environmental conditions. The transformer T output is used to provide an inductance for tuning the amplifier to the desired frequency and also to introduce an additional 180 degree phase shift. An overall shunt type negative feedback path (21—22) is provided to achieve long and short term stability, freedom from noise and distortion, low input impedance and constancy of gain for operation at reduced supply potentials and adverse environmental conditions. To achieve freedom from oscillations, or "singing," high frequency transistors are used for this low frequency amplifier in conjunction with special shaping networks. By using the high frequency transistors (Beta cut-off frequency i.e. frequency where the ratio of collector current to base current with the collector shorted is 3 db below the midband current ratio, of 100 kc. or greater) extremely simple networks consisting of a series resistor and condenser may be used for achieving freedom from oscillations. The above stabilization techniques are used for insuring against oscillations at high frequencies.

To insure against low frequency oscillations the coupling and bypass condensers are carefully chosen. The typical margins of stability achieved are as follows:

High frequency—
    Gain margin of 22 db
    Phase margin of 60°
Low frequency—
    Gain margin of 20 db
    Phase margin of 80°

In the first stage of the amplifier, resistors R9, R11, R12 and R17 serve to provide a stable direct current operating bias. Resistor R17 provides direct current collector voltage feedback in the form of a forward or positive current. Resistor R11 provides direct current collector current feedback in the form of a reverse bias current. These two resistors (R11, R17) are selected to provide the desired direct current stability factor in accordance with the value of resistor R12 which serves to establish a direct current load line and thus provide a suitable operating point. After resistors R11, R12 and R17 are selected for a particular load line and direct current stability factor, resistor R9 is chosen to give the desired base current for a particular operating point. The value of resistor R17 is such that it contributes negligible A.-C. degeneration. Resistor R11 is bypassed by condenser C12 at the desired operating frequency to prevent any A.-C. degeneration. Condenser C14 serves to couple the collector of the first stage of the amplifier to the input of the second stage. Resistor R16 serves in the identical manner as recited for resistor R11, that is, to provide collector direct-current feedback. Forward bias in the second stage is provided by the voltage divider made up of resistors R8 and R13. This is necessary because of the low direct-current load present in the second stage and for making any direct-current collector voltage feedback ineffective.

Condenser C16 serves to eliminate any A.-C. degeneration due to resistor R16. A tap 21 is provided on transformer T1 to enable the loading effects of the A.-C. feedback path consisting of resistor R15 and capacitor C13 to be minimized. This loading effect is due to the low input impedance of the first stage without feedback. Condensers C20 and C19 are used for tuning the amplifier to the desired audio frequency, as is well known in the art. Resistor R15 is used for determining the amount of overall negative feedback in conjunction with the transformer tap. Condenser C13 serves to block the flow of direct-current from the base of the first stage through R15 to ground. To insure low frequency stability, condensers C13, C14 and C16 are chosen to pass all frequencies above 50 c.p.s. with negligible attenuation. Condenser C12 is selected to provide the desired attenuation rate to insure freedom from low frequency oscillation. Thus the selection of transistors having a high cut-off frequency, resistance-capacitance network R10, C11 and R14, C15 connected to these transistors are used to control the attenuation rate, and therefore the margin of stability, at the higher frequencies. Resistors R10 and R14 determine the maximum attenuation which may be obtained while condensers C11 and C15 determine the frequencies at which these two networks begin attenuating. Each network has a maximum attentuation rate of 6 db per octave so that at some frequency the total attenuation of these two networks will be 12 db per octave.

Two shaping networks (R11, C12 and R16, C16) are used to permit the selection of resistance-capacitance networks, R10, R14, C11 and C15 such that negligible losses will occur at the operating frequency. Condenser C17 is used to bypass the supply potential to eliminate any of its internal impedance effects.

The advantages of this novel amplifier circuit will be apparent to a person skilled in the art, as recited herein.

A power consumption is in the order of 27 mw. Low impedance circuits are used throughout thus minimizing pickup problems. Transistors have a theoretically infinite life which greatly reduces replacement and maintenance cost. This novel circuit requires only one low voltage power supply thereby eliminating costly transformers and wiring. Special transistors are not required as the standard units meeting manufacturers specifications will be sufficient for the purpose and may be used without modifications. An improvement in noise output of about two to one is achieved. All the components are non-critical and are of 10% tolerance except for the transformer turns ratio which preferably is 3.5 to 1 from ground to the tap in the secondary, and resistance R15 which is plus or minus one percent of the rated value.

Obviously many modifications and variations of the present invention are possible in the light of the above teachings. It is therefore to be understood that within the scope of the appended claim the invention may be practiced otherwise than as specifically described.

What is claimed as new and desired to be secured by Letters Patent of the United States is:

A two stage, low frequency, tuned, audio amplifier comprising; first and second high frequency transistors, each of said transistors having a beta cut-off frequency in the order of 100 kc. or greater and having a base, an emitter and a collector, means connected to the base of each of said transistors for providing a D.-C. bias thereto, said means including a first resistor connected between the collector of said first transistor and the base thereof and a second resistor connected between the collector and a source of D.-C. operating potential, a shaping network consisting of a parallel resistor-capacitor circuit connected between each of said emitters and ground, a series resistor-capacitor circuit connected between each of said bases and ground for preventing high frequency oscillations, the collector of said first transistor being capacitance coupled to the base of said second transistor, a transformer connected to the collector of said second transistor, a capacitor tuning circuit connected across the secondary of said transformer, and a negative feedback circuit comprising a resistor and a capacitor connected between said secondary and the base of said first transistor, whereby exceptionally high long and short term stability is achieved.

References Cited in the file of this patent

UNITED STATES PATENTS

| | | |
|---|---|---|
| 2,866,859 | Stanley | Dec. 30, 1958 |
| 2,874,236 | Sikorra | Feb. 17, 1959 |
| 2,885,498 | Bruck | May 5, 1959 |
| 2,931,988 | Bussard | Apr. 5, 1960 |
| 2,951,991 | Rickner | Sept. 6, 1960 |

FOREIGN PATENTS

| | | |
|---|---|---|
| 1,111,777 | France | Mar. 5, 1956 |

OTHER REFERENCES

Electronics, June 1, 1957, pages 140–142.